(12) United States Patent
Lee et al.

(10) Patent No.: US 9,099,310 B1
(45) Date of Patent: Aug. 4, 2015

(54) METHOD OF MANUFACTURING HORIZONTALLY ALIGNED SINGLE CRYSTALLINE INORGANIC NANOWIRE PATTERNS

(71) Applicant: POSTECH ACADEMY-INDUSTRY FOUNDATION, Pohang (KR)

(72) Inventors: Tae-Woo Lee, Pohang (KR); Sung-Yong Min, Gwangju (KR)

(73) Assignee: POSTECH ACADEMY-INDUSTRY FOUNDATION, Pohang-Si (KR)

( * ) Notice: Subject to any disclaimer, the term of this patent is extended or adjusted under 35 U.S.C. 154(b) by 0 days.

(21) Appl. No.: 14/420,041

(22) PCT Filed: Sep. 6, 2013

(86) PCT No.: PCT/KR2013/008072
§ 371 (c)(1),
(2) Date: Feb. 6, 2015

(87) PCT Pub. No.: WO2014/046407
PCT Pub. Date: Mar. 27, 2014

(30) Foreign Application Priority Data

Sep. 24, 2012 (KR) .................. 10-2012-0105843

(51) Int. Cl.
*H01L 21/31* (2006.01)
*H01L 21/02* (2006.01)
*C30B 7/14* (2006.01)
*C30B 29/60* (2006.01)
*C30B 29/12* (2006.01)
*C30B 29/54* (2006.01)
*H01L 29/06* (2006.01)

(52) U.S. Cl.
CPC ............ *H01L 21/02603* (2013.01); *C30B 7/14* (2013.01); *C30B 29/12* (2013.01); *C30B 29/54* (2013.01); *C30B 29/60* (2013.01); *H01L 21/0242* (2013.01); *H01L 21/02422* (2013.01); *H01L 21/02628* (2013.01); *H01L 21/02664* (2013.01); *H01L 29/0676* (2013.01)

(58) Field of Classification Search
CPC ................. H01L 21/02628; H01L 21/02664; H01L 21/02422; H01L 21/0242
USPC ................................................. 438/758
See application file for complete search history.

(56) References Cited

U.S. PATENT DOCUMENTS

| | | | |
|---|---|---|---|
| 7,741,197 B1 * | 6/2010 | Duan et al. ............. | 438/478 |
| 2005/0221083 A1 * | 10/2005 | Belcher et al. .......... | 428/364 |
| 2008/0150165 A1 * | 6/2008 | Stumbo et al. .......... | 257/784 |
| 2009/0029070 A1 | 1/2009 | Quintero Martinez et al. | |
| 2011/0073837 A1 * | 3/2011 | Zhou et al. .............. | 257/13 |

FOREIGN PATENT DOCUMENTS

| KR | 10-2009-0098341 | 9/2009 |
|---|---|---|
| KR | 10-0981733 | 9/2010 |
| KR | 10-2012-0036268 | 4/2012 |

* cited by examiner

*Primary Examiner* — Douglas Menz
(74) *Attorney, Agent, or Firm* — Lexyoume IP Meister, PLLC

(57) ABSTRACT

Disclosed is that a method of manufacturing horizontally aligned single crystalline inorganic nanowire patterns, including mixing an inorganic precursor and an organic polymer in water or an organic solvent to prepare an inorganic-polymer liquid, forming inorganic precursor/organic polymer composite nanowire patterns aligned on a substrate using the inorganic-polymer liquid, and irradiating eximer laser along the aligned inorganic precursor/organic polymer composite nanowire patterns.

13 Claims, 4 Drawing Sheets

METHOD OF MANUFACTURING HORIZONTALLY ALIGNED SINGLE CRYSTALLINE INORGANIC NANOWIRE PATTERNS

TECHNICAL FIELD

The present invention relates to a method of manufacturing horizontally aligned single crystalline inorganic nanowire patterns.

BACKGROUND ART

In a future information-oriented society where information may be obtained anytime and anywhere (ubiquitous), amounts of information that may be obtained or processed by people through "wearing computers" and "flexible displays" will remarkably increase. In addition, as communication channels among people become more various, it is expected to be more global. Therefore, requirements for smaller electronic devices with high performance are increasing and interests in nano-sized electronic devices are increasing.

Since inorganic nanowires that are one-dimensional inorganic nanostructures have a higher electric characteristic than that of a bulk inorganic material, researches on using inorganic semiconductor nanowires as an active layer are actively performed in a semi-conductor device field.

The most representative method of manufacturing inorganic semiconductor nanowires is to grow nanowires on a substrate through chemical vapor deposition. When silicon nanowires or zinc oxide nanowires manufactured by the chemical vapor deposition are used for manufacturing a transistor, a transistor having high mobility may be manufactured. However, since the nanowires manufactured by the above process are vertically grown on the substrate, an additional process of separating the nanowires from the substrate to horizontally align the nanowires is required. In this process, since the nanowires irregularly spread, it is not possible to manufacture a highly integrated nanowire device array. In addition, in order to deposit an electrode on one nanowire, since an expensive equipment such as an E-beam evaporation must be used, manufacturing cost of a device is increased.

In another method of manufacturing inorganic semiconductor nanowires, a large amount of zinc oxide nanowires are manufactured through electrospinning, which is studied by the Chinese Pan group. In this method, a zinc oxide precursor and polyvinyl alcohol are mixed with each other, an electrospinning is performed to manufacture precursor/organic composite nanowires and pyrolysis of an organic material is performed to manufacture the zinc oxide nanowires.

However, through the electrospinning, very irregularly twisted nanowires are manufactured. In order to manufacture an electronic device using nanowires, since the nanowires must be aligned to some degree, it is very difficult to apply the nanowires manufactured by the electrospinning to manufacturing of the electronic device.

In addition, the manufactured nanowires are polycrystalline materials in which a size of a grain is only several nanometers. In order to use the nanowires for the electronic device, since the nanowires must be single crystalline nanowires, it is difficult to apply the manufactured nanowires to manufacturing of a high performance electronic device.

Therefore, a method of correctly horizontally aligning inorganic nanowires in desired positions and manufacturing single crystalline nanowires is required.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

An object of the present invention is to provide a method of manufacturing horizontally aligned single crystalline inorganic nanowire patterns capable of horizontally aligning inorganic nanowires in desired positions and manufacturing single crystalline nanowires.

Solution to Problem

According to the present invention, there is provided a method of manufacturing horizontally aligned single crystalline inorganic nanowire patterns, including mixing an inorganic precursor and an organic polymer in water or an organic solvent to prepare an inorganic-polymer liquid, forming inorganic precursor/organic polymer composite nanowire patterns aligned on a substrate using the inorganic-polymer liquid, and irradiating eximer laser along the aligned inorganic precursor/organic polymer composite nanowire patterns.

The inorganic precursor may be an inorganic semiconductor precursor selected from a group consisting of zinc hydroxide ($Zn(OH)_2$), zinc acetate ($Zn(CH_3COO)_2$), zinc acetate hydrate ($Zn(CH_3(COO)_2 \cdot nH_2O$), diethyl zinc ($Zn(CH_3COO)_2$), zinc nitrate ($Zn(NO_3)_2$), zinc nitrate hydrate ($Zn(NO^3)_2 \cdot nH_2O$), zinc carbonate ($Zn(CO_3)$), and a mixture thereof; a metal precursor selected from a group consisting of dihydrogen hexachloroplatinate (IV) hexahydrate, copper acetate, aluminum nitrate, and a mixture thereof; or a mixture of the inorganic semiconductor precursor and the metal precursor.

The organic polymer may be a polymer selected from a group consisting of polyvinyl alcohol (PVA), polyethylene oxide (PEO), polystyrene (PS), polycaprolactone (PCL), polyacrylonitrile (PAN), poly(methyl methacrylate) (PMMA), polyimide, poly(vinylidene fluoride) (PVDF), polyaniline (PANI), polyvinylchloride (PVC), nylon, poly(acrylic acid), poly(chloro styrene), poly(dimethyl siloxane), poly(ether imide), poly(ether sulfone), poly(alkyl acrylate), poly(ethyl acrylate), poly(ethyl vinyl acetate), poly(ethyl-co-vinyl acetate), poly(ethylene terephthalate), poly(lactic acid-co-glycolic acid), poly(methacrylate), poly(methyl styrene), poly(styrene sulfonate), poly(styrene sulfonyl fluoride), poly(styrene-co-acrylonitrile), poly(styrene-co-butadiene), poly(styrene-co-divinyl benzene), poly(vinyl acetate), polylactide, poly(vinyl alcohol), polyacrylamide, polybenzimidazole, polycarbonate, poly(dimethylsiloxane-co-polyethyleneoxide), poly(etheretherketone), polyethylene, polyethyleneimine, polyisoprene, polylactide, polypropylene, polysulfone, polyurethane, poly(vinylpyrrolidone), and a mixture thereof.

The organic solvent may be selected from a group consisting of dichloromethylene, trichloroethylene, chloroform, chlorobenzene, dichlorobenzene, styrene, dimethyl-formamide, dimethylformaldehyde, dimethylsulfoxide, xylene, toluene, cyclohexane, isopropfylalcohol, ethanol, methanol, acetone, and a mixture thereof.

The substrate may be an insulator material selected from a group consisting of a glass plate, a plastic film, and a paper or a conductor/insulator composite material selected from a group consisting of silicon, silicon (Si)/silicondioxide ($SiO_2$), and aluminum (Al)/aluminum oxide ($Al_2O_3$).

The aligned inorganic precursor/organic polymer composite nanowire patterns may be formed by aligning the aligned inorganic precursor/organic polymer composite nanowire patterns on the substrate in a desired position and a desired direction using an electric field aided robotic nozzle printer.

The irradiating eximer laser along the aligned inorganic precursor/organic polymer composite nanowire patterns may be performed by irradiating a laser with a pulse frequency of 1 Hz to 1000 Hz and with energy of 100 mJ/cm² to 1000 mJ/cm² in a pulse period of 1 fs to 500 ns.

Irradiating eximer laser along the aligned inorganic precursor/organic polymer composite nanowire patterns is performed by a laser injection system. The laser injection system may include an excimer laser, a precision translation xy-stage for moving a substrate, an energy attenuator for controlling energy of the laser, a laser mirror for controlling a laser path, and a cylindrical lens for concentrating a laser beam on the substrate.

In the precision translation xy-stage, a minimum movement distance is 100 nm to 20 cm and a minimum transfer speed is 1 μm/s to 10 cm/s.

According to another exemplary embodiment of the present invention, there are provided a transistor, a self-powered piezoelectric device, and an electrically driven biosensor manufactured using the single crystalline inorganic nanowires manufactured by the above-described method.

Particulars of exemplary embodiments of the present invention are included in the following detailed description.

Advantageous Effects of Invention

In the manufacturing method according to the present invention, it is possible to correctly control a position and a direction of the inorganic nanowires and to manufacture the nanowires to be single crystalline. Therefore, when the manufactured nanowires are used as a semiconductor inorganic material, it is possible to rapidly and simply manufacture a high performance nanowire transistor with a large area.

In addition, when a metal precursor is used, since single crystalline metal nanowires may be aligned, the single crystalline metal nanowires may be used as an electrode of a transparent display or a transparent solar battery.

BEST MODE FOR CARRYING OUT THE INVENTION

Hereinafter, an exemplary embodiment of the present invention will be described in detail. The present invention is not limited to the exemplary embodiment but is defined by claims to be described later.

An exemplary embodiment of the present invention relates to a method of manufacturing horizontally aligned single crystalline inorganic nanowires. According to the exemplary embodiment of the present invention, "single crystalline" may include semi-single crystalline as well as single crystalline and an "inorganic material" may include all metals as well as an inorganic material commonly referred to in an organic chemical field.

Figure 1:
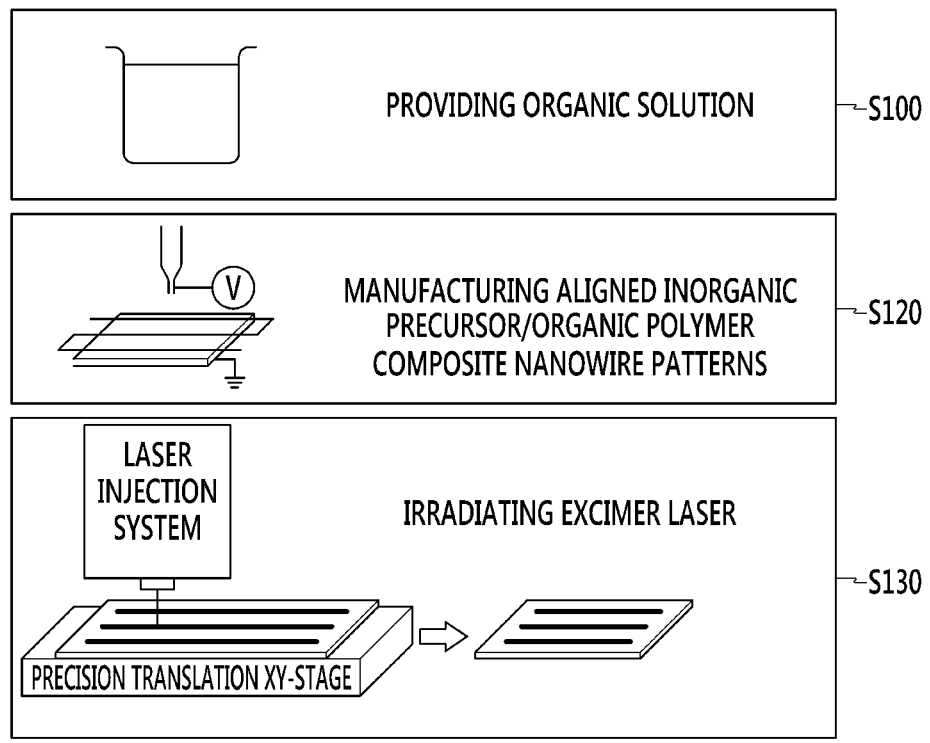
FIG. 1 is a flowchart schematically illustrating processes of manufacturing horizontally aligned single crystalline inorganic nanowire pattern according to an exemplary embodiment of the present invention.

The manufacturing method according to the exemplary embodiment of the present invention will be described hereinafter with reference to FIG. 1.

First, an inorganic precursor and an organic polymer are mixed by water or an organic solvent to provide an inorganic-polymer liquid S110. The inorganic precursor may be an inorganic semiconductor precursor selected from a group consisting of zinc hydroxide ($Zn(OH)_2$), zinc acetate ($Zn(CH_3COO)_2$), zinc acetate hydrate ($Zn(CH_3(COO)_2 \cdot nH_2)$), diethyl zinc ($Zn(CH_3CH_2)_2$), zinc nitrate ($Zn(NO_3)_2$), zinc nitrate hydrate ($Zn(NO_3)_2 \cdot nH_2O$), zinc carbonate ($Zn(CO_3)$), and a mixture thereof: a metal precursor selected from a group consisting of dihydrogen hexachloroplatinate (IV) hexahydrate, copper acetate, aluminum nitrate, and a mixture thereof; or a mixture of the inorganic semiconductor precursor and the metal precursor. However, the inorganic precursor is not limited to the above.

The organic polymer may be a polymer selected from a group consisting of polyvinyl alcohol (PVA), polyethylene oxide (PEO), polystyrene (PS), polycaprolactone (PCL), polyacrylonitrile (PAN), poly(methyl methacrylate) (PMMA), polyimide, poly(vinylidene fluoride) (PVDF), polyaniline (PANI), polyvinylchloride (PVC), nylon, poly (acrylic acid), poly(chloro styrene), poly(dimethyl siloxane), poly(ether imide), poly(ether sulfone), poly(alkyl acrylate), poly(ethyl acrylate), poly(ethyl vinyl acetate), poly(ethyl-co-vinyl acetate), poly(ethylene terephthalate), poly(lactic acid-co-glycolic acid), poly(methacrylate), poly(methyl styrene), poly(styrene sulfonate), poly(styrene sulfonyl fluoride), poly (styrene-co-acrylonitrile), poly(styrene-co-butadiene), poly (styrene-co-divinyl benzene), poly(vinyl acetate), polylactide, poly(vinyl alcohol), polyacrylamide, polybenzimidazole, polycarbonate, poly(dimethylsiloxane-co-polyethyleneoxide), poly(etheretherketone), polyethylene, polyethyleneimine, polyisoprene, polylactide, polypropylene, polysulfone, polyurethane, poly(vinylpyrrolidone), and a mixture thereof, however, is not limited to the above.

The organic solvent may be selected from a group consisting of dichloroethylene, trichloroethylene, chloroform, chlorobenzene, dichlorobenzene, styrene, dimethylformamide, dimethylformaldehyde, dimethylsulfoxide, xylene, toluene, cyclohexane, isopropfylalcohol, ethanol, methanol, acetone, and a mixture thereof, however, is not limited to the above.

A mixing ratio between the inorganic precursor and the organic polymer may be 10: 90 to 90:10 weight ratio. When the mixing ratio of the inorganic precursor and the organic polymer is included in the range, finally obtained inorganic nanowires may not be broken but may be formed. with a uniform diameter. Since the organic polymer is decomposed by laser irradiation, when an organic polymer ratio is larger than 90 weight ratio, an amount of inorganic material remained after laser irradiation is insufficient so that nanowires may not be uniformly formed but may be broken. In addition, when the organic polymer ratio is less than 10 weight ratio, viscosity of an inorganic-polymer liquid is too low so that inorganic precursor/organic polymer composite nanowire patterns may not be properly formed by an electric field aided robotic nozzle printer.

The concentration of the inorganic-polymer liquid may be 3 wt % to 20 wt %. When the mixing ratio between the inorganic precursor and the organic polymer is included in a preferable range and the concentration of the inorganic-polymer liquid is included in the range, viscosity of the liquid is sufficient so that the nanowire patterns may be formed by the electric field aided robotic nozzle printer. When the concentration of the inorganic-polymer liquid is less than 3 wt %, the viscosity of the inorganic-polymer liquid is too low so that not the nanowires but a liquid drop may be formed. In addition, when the concentration of the inorganic-polymer liquid is larger than 20 wt %, the viscosity of the inorganic-polymer liquid is too high so that the inorganic-polymer liquid is not properly discharged through the electric field aided robotic nozzle printer.

Then, the inorganic precursor/organic polymer composite nanowire patterns are formed on a substrate using the inorganic-polymer liquid S120. The substrate may be an insulator material selected from a group consisting of a glass plate, a plastic film, and a paper or a conductor/insulator composite material selected from a group consisting of silicon, silicon (Si)/silicondioxide ($SiO_2$), and aluminum (Al)/aluminum oxide ($Al_2O_3$), however, is not limited to the above. The silicon/silicon dioxide substrate refers to a silicon substrate coated with $SiO_2$ to a thickness of 10 nm to 1 μm.

Figure 2A:
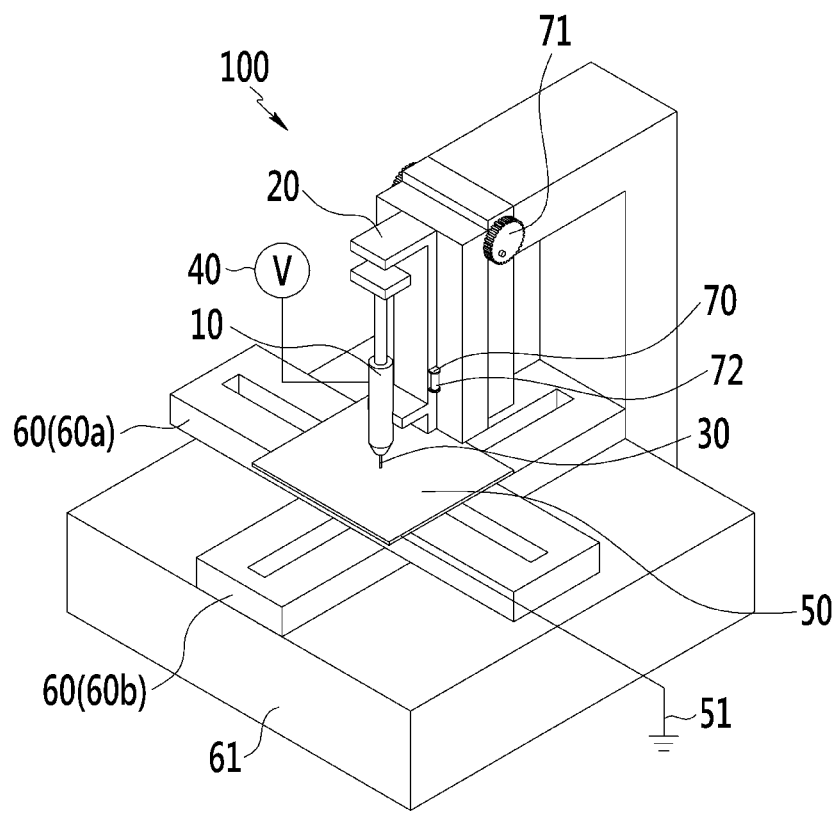
FIG. 2a is a schematic diagram schematically illustrating an electric field aided robotic nozzle printer used during manufacturing of aligned inorganic precursor/organic polymer composite nanowire patterns in a manufacturing method according to an exemplary embodiment of the present invention.
Figure 2B:
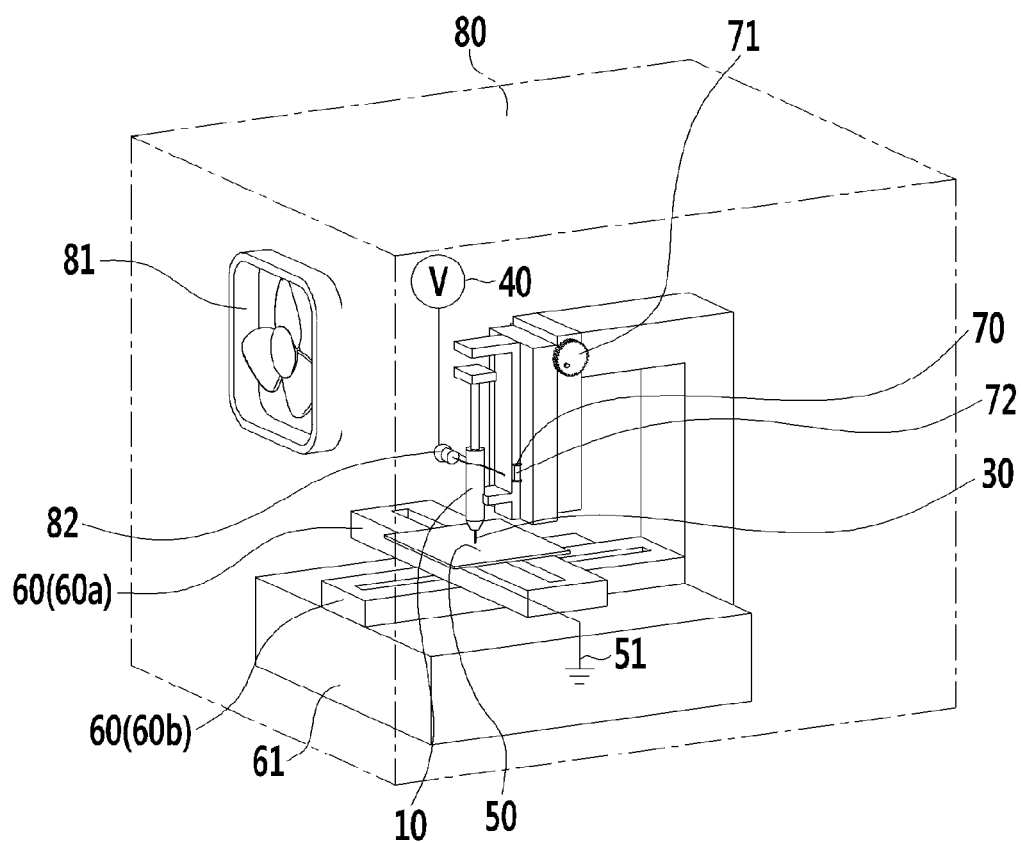
FIG. 2b is a schematic diagram schematically illustrating structures of the electric field aided robotic nozzle printer illustrated in FIG. 2a and a housing that surrounds the electric field aided robotic nozzle printer.

Forming the aligned inorganic precursor/organic polymer composite nanowire patterns may be performed using the electric field aided robotic nozzle printer 100 illustrated in FIGS. 2a and 2b.

The electric field aided robotic nozzle printer 100 according to the present invention includes a solution storage apparatus 10, a discharge controller 20, a nozzle 30, a voltage applying apparatus 40, a collector 50, a robot stage 60, a granite plate (base plate) 61, and a micro distance controller 70 as illustrated in FIG. 2a.

The solution storage apparatus 10 contains an organic solution and supplies the organic solution to the nozzle 30 so that the nozzle 30 may discharge the organic solution. The solution storage apparatus 10 may be in the form of a syringe. A material that realizes the solution storage apparatus 10 may be plastic, glass, or stainless steel, however, is not limited to the above. Storage capacity of the solution storage apparatus 10 may be selected in a range between about 1 μl and about 5000 ml, however, is not limited to the above. The storage capacity may be selected in a range between about 10 μl and about 50 ml. When the solution storage apparatus 10 is manufactured by stainless steel, a gas inlet (not shown) through which a gas may be injected is provided in the solution storage apparatus 10 so that the organic solution may be discharged to the outside of the solution storage apparatus 10 using pressure of the gas. On the other hand, in order to form core shell structured organic wires, the solution storage apparatuses 10 may be plural.

The discharge controller 20 applies pressure to the organic solution in the solution storage apparatus 10 in order to discharge the organic solution in the solution storage apparatus 10 through the nozzle 30 at a uniform speed. A pump or gas pressure controller may be used as the discharge controller 20. The discharge controller 20 may control the discharge speed of the organic solution in a range between 1nel min and 50 ml/min. In case of using the plurality of solution storage apparatuses 10, the discharge controllers 20 may be provided in the solution storage apparatuses 10, respectively, so that the discharge controllers 20 may independently operate. In case of the solution storage apparatus 10 formed of stainless steel, a gas pressure controller (not shown) may be used as the discharge controller 20.

The nozzle 30 receives the organic solution from the solution storage apparatus 10 to discharge the organic solution. The discharged organic solution may form a liquid drop at an end of the nozzle 30. A diameter of the nozzle 30 may be in a range between about 15 μm and about 1.5 mm, however, is not limited to the above.

The nozzle 30 may include a single nozzle, a dual-concentric nozzle, and a triple-concentric nozzle. When the core shell structured organic wires are formed, the dual-concentric nozzle or the triple-concentric nozzle may he used to discharge no less than two kinds of organic solutions. In this case, two or three solution storage apparatuses 10 may be connected to the dual-concentric nozzle or the triple-concentric nozzle.

The voltage applying apparatus 40 for applying a high voltage to the nozzle 30 may include a high voltage generating apparatus. The voltage applying apparatus 40 may be electrically connected to the nozzle 30 through, for example, the solution storage apparatus 10. The voltage applying apparatus 40 may apply a voltage in a range between about 0.1 kV and about 30 kV. However, the present invention is not limited to the above. An electric field exists between the nozzle 30 to which the high voltage is applied by the voltage applying apparatus 40 and the grounded collector 50. The liquid drop formed at the end of the nozzle 30 forms a Taylor cone by the electric field and the organic wires are continuously formed at the end of the nozzle 30.

The collector 50 is a part to which the organic wires formed of the organic solution discharged by the nozzle 30 are aligned and adhered. The collector 50 is flat and may be moved by the robot stage 60 thereunder on a horizontal plane. The collector 50 is grounded to relatively have ground characteristics with respect to the high voltage applied to the nozzle 30. The reference numeral 51 denotes that the collector 50 is grounded. The collector 50 may be formed of a conductive material, for example, a metal and may have flatness within 10 μm (when flatness of a completely horizontal plane has a value of 0, the flatness represents the maximum error value from the plane).

The robot stage 60 moves the collector 50. The robot stage 60 may be driven by a servo motor to be moved at a precise speed. The robot stage 60 may be controlled, for example, to move in two directions of an x axis 60a and a y axis 60b on a horizontal plane. The robot stage 60 may be moved in a range between 100 nm and 100 cm. However, the present invention is not limited to the above. The robot stage 60 may be preferably moved in a range between 10 μm and 20 cm. A movement speed of the robot stage 60 may be controlled in a range between 1 mm/min and 60000 mm/min, however, is not limited to the above. The robot stage 60 may be provided on the granite plate 61 and may have flatness within 10 μm. A distance between the nozzle 30 and the collector 50 may be uniformly controlled by the flatness of the granite plate 61. The granite plate 61 may suppress a vibration generated by the operation of the robot stage to control precision of organic wire patterns.

The micro distance controller 70 controls the distance between the nozzle 30 and the collector 50. The micro distance controller 70 may vertically move the solution storage apparatus 10 and the nozzle 30 to control the distance between the nozzle 30 and the collector 50.

The micro distance controller 70 may include a jog 71 and a micrometer 72. The jog 71 may be used for approximately controlling a distance in units of mm or cm and the micrometer 72 may be used for controlling a minute distance of at least 10 μm. After having the nozzle 30 approach the collector 50 by the jog 71, the distance between the nozzle 30 and the collector 50 may be correctly controlled by the micrometer 72. The distance between the nozzle 30 and the collector 50 may be controlled by the micrometer 70 in a range between 10 μm and 20mm. For example, the collector 50 that is parallel to an x-y plane may be moved on the x-y plane by the robot stage 60 and the distance between the nozzle 30 and the collector 50 may be controlled by the micro distance controller 70 in a z direction.

In the paper of D.H. Reneker, A. L. Yarin, H. Fong, S. Koombhongse, "Bending instability of electrically charged liquid jets of polymer solutions in electospinning " *J. Appl. Phys.*, 87, 9, 4531-4546 2000 where a three-dimensional path of nanofiber spinned from a nozzle in electrospinning is calculated, it is disclosed that perturbation of the nanofiber is increased as the distance between the collector and the nozzle is increased.

According to the paper, $$x = 10^{-3} L \cos\left(\frac{2\pi}{\lambda} z\right) \frac{h-z}{h} \quad \text{EQUATION 1a}$$

$$y = 10^{-3} L \sin\left(\frac{2\pi}{\lambda} z\right) \frac{h-z}{h}. \quad \text{EQUATION 1b}$$

Wherein, x and y are positions of x and y axes directions on a plane horizontal to the collector, L is a constant that represents a length scale, λ is a perturbation wavelength, z is a vertical position to the collector (z=0) of the organic, and h is a distance between the nozzle and the collector. It is noted from the EQUATIONS 1a and 1b that the values x and y that represent the perturbation of the organic wire are increased as the distance h between the collector and the nozzle is increased with respect to the same value z.

Actually, the organic wire generated from the liquid, drop at the end of the nozzle to be extended is almost in the form of a straight line in a z direction vertical to the collector near the nozzle from which the nano organic wire is discharged. However, a lateral velocity of the organic wire is increased away from the nozzle so that the organic wire is curved.

The electric field aided robotic nozzle printer 100 according to an exemplary embodiment of the present invention may sufficiently reduce the distance between the nozzle 30 and the collector 50 in units of tens to several tens micrometers so that the nanowires may linearly fall on the collector 50 before being perturbed. Therefore, the organic wire patterns may be formed by the movement of the collector 50.

Forming the organic wire patterns by the movement of the collector reduces a perturbation variable of the organic wire patterns in comparison with forming the organic wire patterns by the movement of the nozzle so that a more. precise organic wire patterns may he formed.

On the other hand, the electric field aided robotic nozzle printer 100 may be provided in a housing 80 as illustrated in FIG. 2b. The housing 80 may be formed of a transparent material. The housing 80 may be sealed up and a gas may be injected into the housing 8O through a gas inlet (not shown). The injected gas may he nitrogen, dry air, etc., and the organic solution that is easily oxidized by moisture may be stably maintained by the injection of the gas. In addition, a ventilator 81 and a lamp 82 may be provided in the housing 80. The ventilator 81 may control steam pressure in the housing 80 so that an evaporating rate of the solvent may be controlled when the organic wire is formed to be discharged. In robotic nozzle printing where it is required that the solvent he rapidly evaporated, a speed of the ventilator 81 is controlled to be higher so that the evaporation of the solvent is facilitated, which plays art important role in forming the organic wire.

Processes of forming the aligned inorganic precursor/organic polymer composite nanowire patterns using the electric field aided robotic nozzle printer 100 illustrated in FIG. 2a will be described as follows. First, a substrate (not shown) is positioned on the collector 50. After containing the inorganic-polymer liquid in the syringe 10, when the inorganic-polymer liquid is discharged from the nozzle 30 using a syringe pump 20, the liquid drop is formed at the end of the nozzle 30. When the voltage is applied to the nozzle 30 using the high voltage generating apparatus 40, due to an electrostatic force between charge formed in the liquid drop and the collector 50, the liquid drop is not dispersed but is extended in a direction of an electric field to be adhered to the substrate on the collector 50.

At this time, as the liquid drop is extended, the inorganic precursor/organic polymer composite nanowires whose length in one direction is larger than that in the other direction may be formed from the liquid drop.

The zinc oxide inorganic precursor/organic polymer composite nanowires formed from the charged material discharged from the nozzle 30 are aligned on the substrate on the collector 50 to form the inorganic precursor/organic polymer composite nano wire patterns. At this time, the distance between the nozzle 30 and the collector 50 is controlled in a range between 10 m and 20 mm so that the inorganic precursor/organic polymer composite nanowires may he formed on the substrate on the collector 50 not to be tangled but to be separated. At this time, the distance between the nozzle 30 and the collector 50 may be controlled by the micro distance controller 70.

In addition, the inorganic precursor/organic polymer composite nanowire patterns aligned in a desired position, in a desired direction, and by a desired number may be formed on the substrate by moving the collector 50.

Then, excimer laser is irradiated along the aligned inorganic precursor/organic polymer composite nanowire patterns S130. Since the polymer is decomposed and the inorganic precursor is converted into an inorganic material by laser heat caused by irradiating the excimer laser, the inorganic material of the horizontally aligned single. crystalline nano wire patterns may be obtained.

Since the inorganic material of the horizontally aligned nano wire patterns may be manufactured, the position and the direction may be correctly controlled so that a transistor device may be simply manufactured only by a thermal deposition equipment when an electrode is deposited. Whereas, if an inorganic material of vertically aligned nano wire patterns is manufactured, after the inorganic material of the nano wire patterns is separated from the substrate, the. inorganic material of the nano wire patterns must be aligned on the substrate again. in order to correctly deposit the electrode in a position where the inorganic material of the, nano wire patterns is aligned, expensive E-beam lithography equipment is required so that it is not economical.

In addition, as the excimer laser is irradiated along the nano wire patterns, since heat is sequentially applied to the nanowires, grains of the nanowires are gradually grown so that a single crystalline inorganic material may be obtained. When the excimer laser is not irradiated along the nano wire patterns but is entirely irradiated or a thermal treatment is performed on the entire substrate, a number of parts of the nanowires simultaneously undergo phase changes so that a number of grains are simultaneously grown and polycrystalline nano wire patterns are obtained, which is not appropriate. In addition, sizes of the generated grains are very small so that the nano wire patterns may not be used for manufacturing a high performance electronic device such as a transistor.

The irradiating the excimer laser may be performed by irradiating a laser with a wavelength of 100 nm to 400 nm, with a pulse frequency of 1 Hz to 1000 Hz, and with energy of 100 mJ/cm$^2$ to 1000 mJ/cm$^2$ in a pulse period of 1fs to 500 ns.

In irradiating excimer laser, if the laser may be irradiated along the nanowire patterns formed on the substrate, any apparatus may be used. However, the laser is preferably irradiated by a laser injection system including an excimer laser, a precision translation xy-stage for moving a substrate, an energy attenuator for controlling energy of the laser; a laser mirror for controlling a laser path; and a cylindrical lens for concentrating a laser beam on the substrate.

Figure 3:
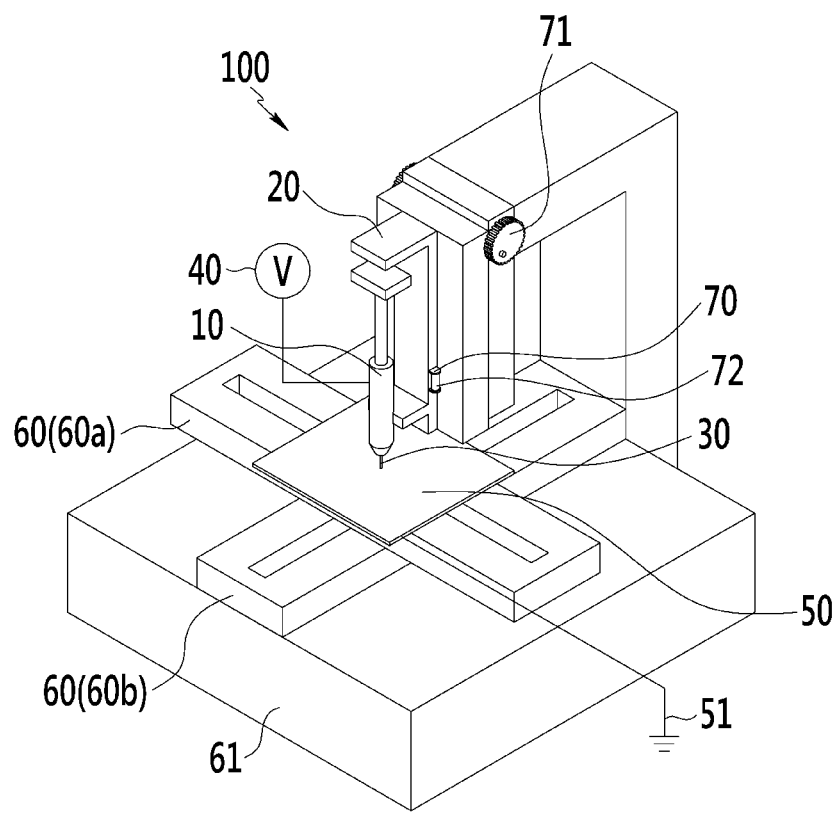
FIG. 3 is a schematic diagram schematically illustrating a laser injection system used for an excimer laser irradiation process in a manufacturing method according to an exemplary embodiment of the present invention.

A schematic structure of the laser injection system is illustrated in FIG. 3. As illustrated in FIG. 3, a laser injection system 300 includes an excimer laser 310, a precision translation xy-stage 320 for moving a substrate, an x axis translation stage 320a, a y axis translation stage 320b, a flat plate 320c on which the substrate is placed, an energy attenuator 330 for controlling energy of the laser, a laser mirror 340 for controlling a laser path 340, and a cylindrical lens 350 for concentrating a laser beam on the substrate. In the precision translation xy-stage, a movement distance may be 100 mn to 20 cm and a transfer speed may be 1 µm/s to 10 cm/s. When the movement distance of the precision translation xy-stage is included in the above range, since the movement distance is smaller than a region irradiated with the laser so that grains are growing, the grains growth may be effectively grown. In addition, when the transfer speed is included in the above range, a growth speed of the grains may be well controlled so that single crystals may be easily formed.

The laser mirror may have a reflectance of no less than 90% with respect to fight of no more than 400 mn. In addition, a focal distance of the cylindrical lens may be 5 cm to 10 cm.

The substrate on which the obtained aligned patterns are formed is placed on the precision translation xy-stage 320 of the laser injection system and the precision translation xy-stage 320 is moved while vertically injecting the excimer laser 310 into ends of the patterns in the form of a pulse. The polymer is decomposed and the inorganic precursor is converted into the inorganic material by heat of the laser. At this time, since the heat is sequentially applied to the nanowires, the grains of the nanowires are gradually grown so that the single crystalline inorganic nanowire patterns may be obtained.

Since the nanowire patterns manufactured by such processes are single crystalline and are horizontally aligned, the nanowire patterns may be usefully applied to manufacturing of a high performance electronic device, for example, a transistor and a selfpowered piezoelectric device. In addition, the nanowire patterns manufactured by an exemplary embodiment of the present invention may be usefully applied to manufacturing of an electrically driven biosensor.

MODE FOR THE INVENTION

Hereinafter, exemplary embodiments of the present invention will be described in detail. The following exemplary embodiments are only for-describing the present invention in detail and the present invention is not limited thereto.

(Example 1)
Dihydrogen hexachloroplatinate (IV) hexahydrate and poly(vinylpyrrolidone) mixed at a weight ratio of 80:20 in a dimethylformaldehyde solvent to prepare an inorganic-polymer liquid. At this time, a concentration of the inorganic-polymer liquid was 15 wt %.

The prepared inorganic-polymer liquid was positioned in the syringe 10 (storage capacity: 1 ml) of the electric field aided robotic nozzle printer illustrated in FIG. 2a. Then, after positioning a silicon substrate on a collector formed of aluminum and having flatness of ±10 µm, while applying a voltage of about 1.5 kV to a nozzle, the inorganic-polymer liquid was discharged from the nozzle by a discharge controller using a nozzle syringe pump. At this time, a discharge speed was 200 nl/min. A liquid drop was generated at the end of the nozzle by the discharge process. Due to electrostatic power between charge formed by the voltage applied to the liquid drop generated by the process and the collector, horizontally aligned inorganic precursor/organic polymer composition nanowire patterns are formed on the substrate of the collector moved by a robot stage.

At this time, a diameter of the used nozzle was 100 µm and a distance between the nozzle and the collector was 6 mm. In the robot stage, a movement distance in a Y axis direction was 100 µm, a movement distance in an X axis direction was 15 cm, and a movement speed was 30000 mm/min. A size of the collector was 20 cm×20 cm and a size of the substrate on the collector was 2 cm×2 cm.

Then, the excimer laser was irradiated along the horizontally aligned inorganic precursor/organic polymer composition nanowire patterns. The excimer laser irradiating process was performed by placing the obtained substrate on the precision translation xy-stage and vertically irradiating the excimer laser while moving it a speed of 1.5 µm/s using the laser injection system illustrated in FIG. 3 including the excimer laser, the precision translation xy-stage, the energy attenuator, the laser mirror, and the cylindrical lens.

At this time, a wavelength of the used excimer laser was 308 nm a pulse frequency was 5 Hz, a pulse period is 30 ns, and energy was 135 mJ/cm$^2$.

In addition, in the precision translation xy-stage, a minimum movement distance was 100 nm and a minimum transfer speed was 1 µm/s. The laser mirror had reflectance of 90% with respect to light of 400 nm. In addition, the focal distance of the cylindrical lens was 5.5 cm.

Platinum nanowires manufactured by the processes were semi-single crystalline and electrical conductivity was about 10$^5$ S/cm.

(Example 2)
Zinc acetate hydrate and polyvinylpyrrolidone were mixed in a weight ratio of 75:25 in a distilled water to prepare an inorganic-polymer liquid. At this time, a concentration of the inorganic-polymer liquid was 12 wt %.

The prepared inorganic-polymer liquid was positioned in the syringe (storage capacity: 1 ml) of the electric field aided robotic nozzle printer illustrated in FIG. 2. Then, after positioning a silicon substrate coated. with silicon dioxide (SiO$_2$) to a thickness of 100 nm on a collector, while applying a voltage of about 2.0 kV to a nozzle, the inorganic-polymer liquid was discharged from the nozzle using the syringe pump. At this time, a discharge speed was 200 nl/min. A liquid drop was generated at an end of the nozzle by the discharge process. Due to electrostatic power between charge formed by the voltage applied to the liquid drop generated by the process and the collector, horizontally aligned inorganic precursor/organic polymer composition nanowire patterns were formed on the substrate of the collector moved by a robot stage.

At this time, a diameter of the used nozzle was 100 μm, a distance between the nozzle and the collector was 5 mm, and the applied voltage was 2.0 kV. In the robot stage, a movement distance in Y axis direction was 4.6 mm and a movement distance in an X axis direction was 15 cm. A size of the collector was 20 cm×20 cm and a size of the substrate on the collector was 2.5 cm×2.5 cm.

The excimer laser was irradiated along the horizontally aligned inorganic precursor/organic polymer composition nanowire patterns. The excimer laser irradiating process was performed by placing the obtained substrate on the precision translation xy-stage and vertically irradiating the excimer laser while moving the precision translation xy-stage at a speed of 1.5 μm/s using the laser injection system illustrated in FIG. 3 including the excimer laser, the precision translation xy-stage, the energy attenuator, the laser mirror, and the cylindrical lens. At this time, a wavelength of the used excimer laser was 308 nm, a pulse frequency was 5 Hz, a pulse period was 30 ns, and energy was 135 mJ/cm$^2$. In the process, zinc oxide nanowires were manufactured on the substrate and the manufactured nanowires were used as a transistor device.

Then, gold with a thickness of 100 nm was deposited on the zinc oxide nanowires through thermal deposition to form source and drain electrodes.

As a result of measuring electric characteristics of devices, respectively, average mobility is about 20 cm$^2$ V·s and an average on/off ratio was about 1.04.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the above-described exemplary embodiments are exemplary and are not limitative.

The invention claimed is:

1. A method of manufacturing horizontally aligned single crystalline inorganic nanowire patterns, the method comprising:
    mixing an inorganic precursor and an organic polymer in water or an organic solvent to provide an inorganic-polymer liquid;
    forming inorganic precursor/organic polymer composite nanowire patterns aligned on a substrate using the inorganic-polymer liquid; and
    irradiating eximer laser along the aligned inorganic precursor/organic polymer composite nanowire patterns.

2. The method of claim 1, wherein the inorganic precursor is an inorganic semiconductor precursor selected from a group consisting of zinc hydroxide($Zn(OH)_2$), zinc acetate ($Zn(CH_3COO)_2$), zinc acetate hydrate($Zn(CH_3(COO)_2$·$nH_2O$), diethyl zinc($Zn(CH_3 CH_2)_2$), zinc nitrate($Zn(NO_3)_2$), zinc nitrate hydrate($Zn(NO_3)_2$·$nH_2O$), zinc carbonate($ZnCO_3$), and a mixture thereof; a metal precursor selected from a group consisting of dihydrogen hexachloroplatinate (IV) hexahydrate, copper acetate, aluminum nitrate, and a mixture thereof; or a mixture of the inorganic semiconductor precursor and the metal precursor.

3. The method of claim 1, wherein the organic polymer is a polymer selected from a group consisting of polyvinyl alcohol (PVA), polyethylene oxide (PEO), polystyrene (PS), polycaprolactone (PCL), polyacrylonitrile (PAN), poly(methyl methacrylate) (PMMA), polyimide, poly(vinylidene fluoride) (PVDF), polyaniline (PANI), polyvinylchloride (PVC), nylon, poly(acrylic acid), poly(chloro styrene), poly (dimethyl siloxane), poly(ether imide), poly(ether sulfone), poly(alkyl acrylate), poly(ethyl acrylate), poly(ethyl vinyl acetate), poly(ethyl-co-vinyl acetate), poly(ethylene terephthalate), poly(lactic acid-co- glycolic acid), poly(methacrylate), poly(methyl styrene), poly(styrene sulfonate), poly(styrene sulfonyl fluoride), poly(styrene-co-acrylonitrile), poly (styrene-co- butadiene), poly(styrene-co-divinyl benzene), poly(vinyl acetate), polylactide, poly(vinyl alcohol), polyacrylamide, polybenzimidazole, polycarbonate, poly(dimethylsiloxane-co-polyethyleneoxide), poly(etheretherketone), polyethylene, polyethyleneimine, polyisoprene, polylactide, polypropylene, polysulfone, polyurethane, poly (vinylpyrrolidone), and a mixture thereof.

4. The method of claim 1, wherein the organic solvent is selected from a group consisting of dichloroethylene, trichloroethylene, chloroform, chlorobenzene, dichlorobenzene, styrene, dimethylformamide, dimethylformaldehyde, dimethylsulfoxide, xylene, toluene, cyclohexane, isopropfylalcohol, ethanol, methanol, acetone, and a mixture thereof.

5. The method of claim 1, wherein the substrate comprises an insulator material selected from a group consisting of a glass plate, a plastic film, and a paper or a conductor/insulator composite material selected from a group consisting of silicon, silicon (Si)/silicondioxide ($SiO_2$), and aluminum (Al)/aluminum oxide ($Al_2O_3$).

6. The method of claim 1, wherein the aligned inorganic precursor/organic polymer composite nanowire patterns are formed by aligning the aligned inorganic precursor/organic polymer composite nanowire patterns on the substrate in a desired position and a desired direction using an electric field aided robotic nozzle printer.

7. The method of claim 1, wherein irradiating eximer laser along the aligned inorganic precursor/organic polymer composite nanowire patterns is performed by a laser injection system.

8. The method of claim 7, wherein the laser injection system comprises:
    an excimer laser;
    a precision translation xy-stage for moving a substrate;
    an energy attenuator for controlling energy of the laser;
    a laser mirror for controlling a laser path; and
    a cylindrical lens for concentrating a laser beam on the substrate.

9. The method of claim 1, wherein, the irradiating eximer laser along the aligned inorganic precursor/organic polymer composite nanowire patterns is performed by irradiating a laser with a pulse frequency of 1 Hz to 1000 Hz and with energy of 100 mJ/cm$^2$ to 1000 mJ/cm$^2$ in a pulse period of 1 fs to 500 ns.

10. The method of claim 8, wherein, in the precision translation xy-stage, a minimum movement distance is 100 nm to 20 cm and a minimum transfer speed is 1 μm/s to 10 cm/s.

11. A transistor manufactured by the horizontally aligned single crystalline inorganic nanowires manufactured by claim 1.

12. A self-powered piezoelectric device manufactured by the horizontally aligned single crystalline inorganic nanowires manufactured by claim 1.

13. An electrically driven biosensor manufactured by the horizontally aligned single crystalline inorganic nanowires manufactured by claim 1.

* * * * *